United States Patent

Akiyama et al.

[11] Patent Number: 5,880,008
[45] Date of Patent: Mar. 9, 1999

[54] METHOD FOR FORMING FIELD OXIDE FILM

[75] Inventors: Yukiharu Akiyama, Tenri; Shinichi Sato, Nara, both of Japan

[73] Assignee: Sharp Kabushiki Kaisha, Osaka, Japan

[21] Appl. No.: 731,431

[22] Filed: Oct. 15, 1996

[30] Foreign Application Priority Data

Oct. 18, 1995 [JP] Japan ..................................... 7-270216

[51] Int. Cl.[6] .................................................. H01L 21/76
[52] U.S. Cl. ........................... 438/444; 438/448; 438/585
[58] Field of Search .................................... 438/448, 362, 438/216, 287, 591, 232, 585, 444

[56] References Cited

U.S. PATENT DOCUMENTS

| 5,106,772 | 4/1992 | Lai . |
| 5,298,451 | 3/1994 | Rao . |
| 5,374,585 | 12/1994 | Smith et al. . |
| 5,399,520 | 3/1995 | Jang . |

FOREIGN PATENT DOCUMENTS

| 59-76472 | 5/1984 | Japan . |
| 294479 | 4/1990 | Japan . |

OTHER PUBLICATIONS

Wolf, S. "Silicon Processing for the VLSI Era: vol. 3–The Submicron MOSFET", Lattice Press, 1995, pp. 648–660.

*Primary Examiner*—George Fourson
*Attorney, Agent, or Firm*—Nixon & Vanderhye P.C.

[57] ABSTRACT

A method for forming a field oxide film includes the steps of: (i) laminating a gate insulating film, a polysilicon layer and a first silicon nitride film over the entire surface of a semiconductor substrate in this order; (ii) patterning the gate insulating film, the polysilicon layer and the first silicon nitride film to a desired shape; (iii) forming a sidewall spacer of a second silicon nitride film on a side wall of the gate insulating film, the polysilicon layer and the first silicon nitride film; (iv) selectively etching a portion of the semiconductor substrate with the first silicon nitride film and the sidewall spacer used as a mask; and (v) forming a field oxide film on the etched portion of the semiconductor substrate in a self-aligned manner relative to the polysilicon layer. According to the invention, lifting up of the polysilicon layer caused by the bird's beak of the field oxide film coming under the polysilicon layer can be reduced. Also, horizontal extension (in a direction parallel to the substrate surface) of the bird's beak can be controlled.

7 Claims, 12 Drawing Sheets

METHOD FOR FORMING FIELD OXIDE FILM

BACKGROUND OF THE INVENTION

1. Field of the Invention

The present invention relates to a method for forming a field oxide film. More particularly, the present invention relates to a method for forming a field oxide film that can be aptly used in a flash memory having a floating gate.

2. Description of the Related Arts

Figure 1:
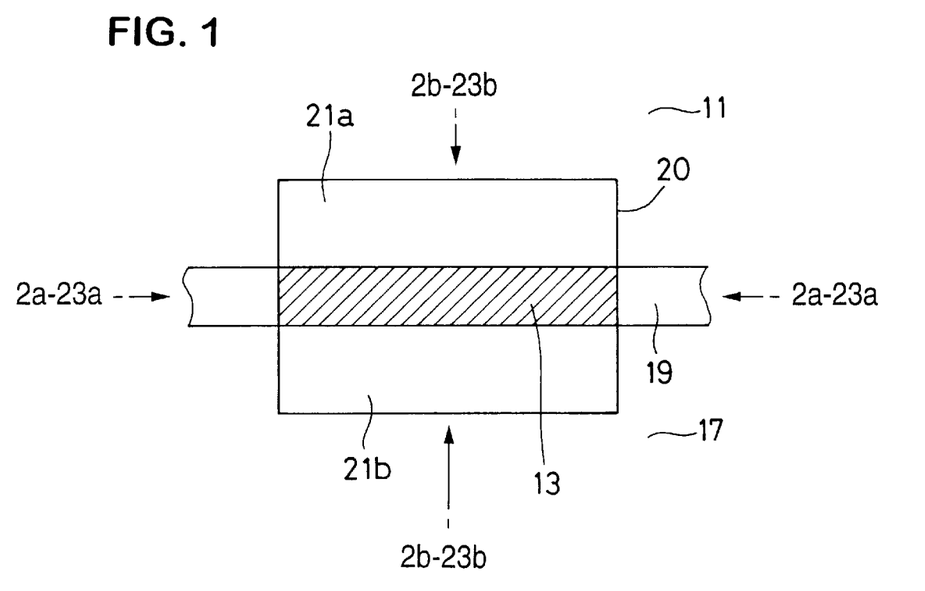
FIG. 1 is a schematic plan view showing an essential part of a semiconductor memory device according to the present invention.

A conventional flash memory having a floating gate will be hereinafter explained in conjunction with the attached drawings. FIG. 1 is a plan view of a flash memory, in which an active region 20 is defined on a silicon substrate 11 by a device isolation region formed of a LOCOS oxide film 17. A floating gate 13 is formed via a gate insulating film on the active region 20. A control gate 19 is formed over the floating gate 13 via an ONO film and extends from the LOCOS oxide film 17 to the active region 20. Also, source/drain regions 21a, 21b are formed in the active region 20 on both sides of the floating gate 13 and the control gate 19.

Figure 18A:
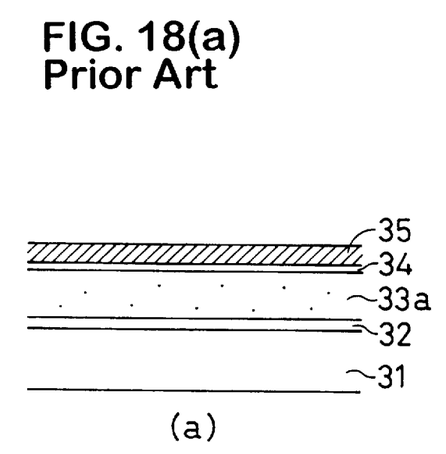
FIGS. 18(a) and 18(b) are schematic cross sections along the line X—X and the line Y—Y, respectively, for explaining a method for manufacturing a conventional semiconductor memory device including the field oxide film.
Figure 18B:
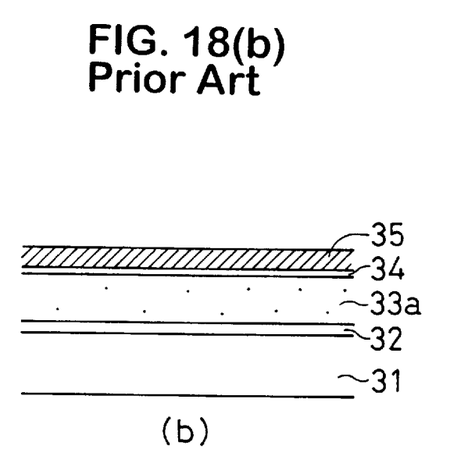

A method for manufacturing the above conventional flash memory will be hereinafter explained. Figures (a) each represent a view showing a cross section along the line X—X of FIG. 1, and Figures (b) each represent a view showing a cross section along the line Y—Y of FIG. 1. First, a gate insulating film 32 is formed to a thickness of about 100 Å on a surface of a p-type silicon substrate 31, and then a polysilicon layer 33a for a floating gate is formed to a thickness of 1000 Å, as shown in FIGS. 18(a) and 18(b). Further, impurity ions are implanted into the polysilicon layer 33a by ion implantation ($N^+$:$^{31}P^+$, 30 keV, $2\times10^{15}$/cm$^2$). Subsequently, a lower oxide film 34 of a thickness of 100 Å and a silicon nitride film 35 (hereafter referred to as a nitride film) of a thickness of 200 Å are formed. The lower oxide film 34 and the nitride film 35 will be part of an ONO film [HTO (High Temperature CVD Silicon Dioxide) 150 Å/SiN 250 Å/HTO 100 Å] formed on the polysilicon layer 33a.

Figure 19A:
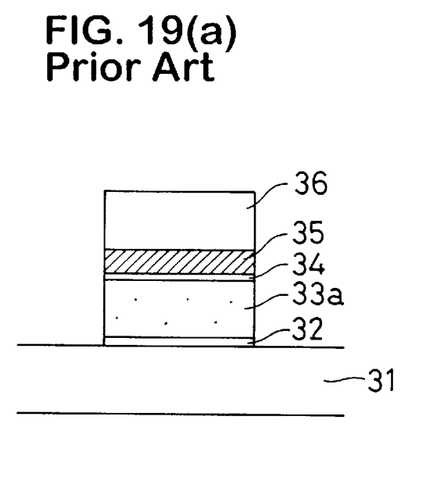
FIGS. 19(a) and 19(b) are schematic cross sections along the line X—X and the line Y—Y, respectively, for explaining the method for manufacturing the conventional semiconductor memory device including the field oxide film.
Figure 19B:
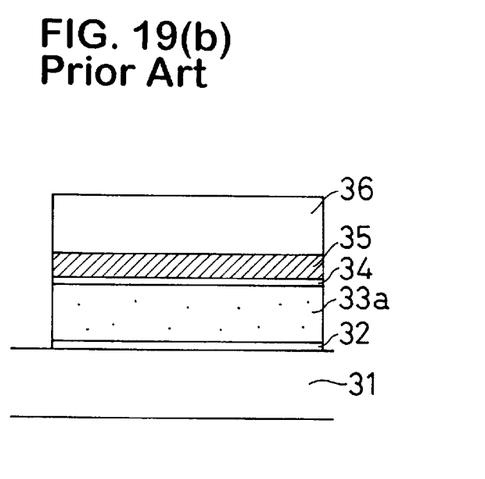

Then, a resist pattern 36 is formed on the nitride film 35 to cover the entire surface of the active region on the silicon substrate 31. With the resist pattern 36 used as a mask, the nitride film 35, the lower oxide film 34, the polysilicon layer 33a, and the gate insulating film 32 are successively etched, as shown in FIGS. 19(a) and 19(b).

Figure 20A:
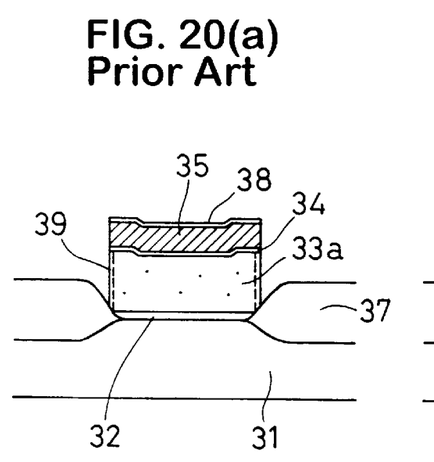
FIGS. 20(a) and 20(b) are schematic cross sections along the line X—X and the line Y—Y, respectively, for explaining the method for manufacturing the conventional semiconductor memory device including the field oxide film.
Figure 20B:
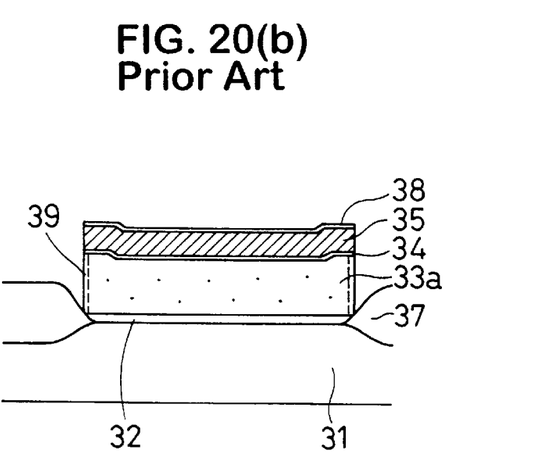

Subsequently, the resist pattern 36 is removed and, with the nitride film 35 used as a mask, selective LOCOS oxidation is performed on the p-type silicon substrate 31 to form a field oxide film 37 to a thickness of 6000 Å for device isolation of the active region, as shown in FIGS. 20(a) and 20(b). At this step, an oxide film of a thickness of about 100 Å is formed on the nitride film 35. The oxide film will be an upper oxide film 38 of the ONO film. Also, at this step, an oxide film 39 is formed on the sidewall of the polysilicon layer 33a.

Figure 21A:
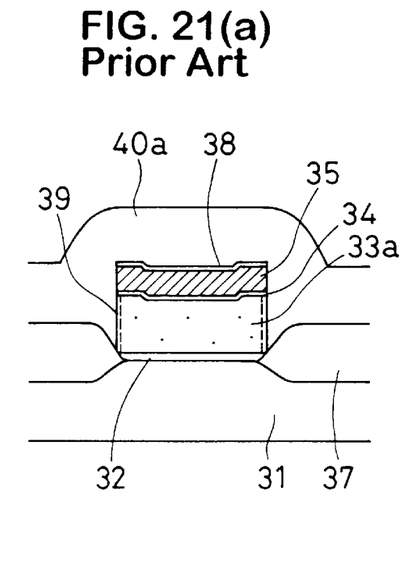
FIGS. 21(a) and 21(b) are schematic cross sections along the line X—X and the line Y—Y, respectively, for explaining the method for manufacturing the conventional semiconductor memory device including the field oxide film.
Figure 21B:
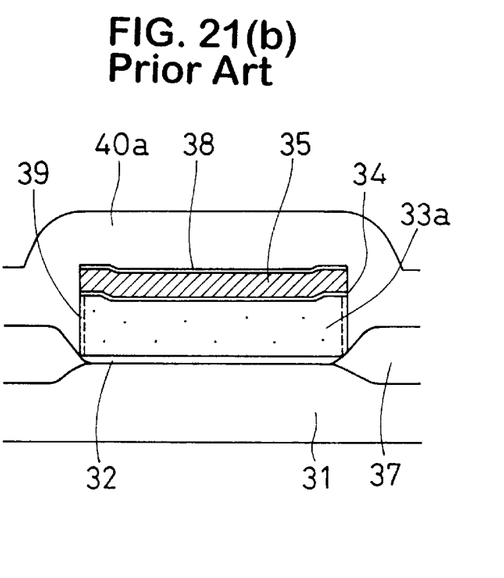

Next, a polysilicon layer 40a for a control gate is deposited to a thickness of 1000 Å, as shown in FIGS. 21(a) and 21(b), and ion implantation ($N^+$: $^{31}P^+$, 60 keV, $5\times10^{12}$/cm$^2$) is carried out into the polysilicon layer 40a.

Figure 22A:
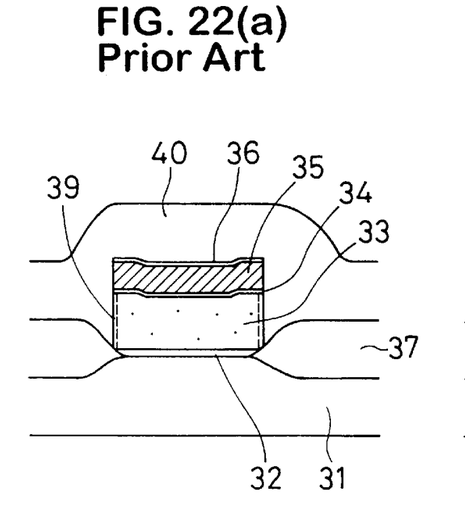
FIGS. 22(a) and 22(b) are schematic cross sections along the line X—X and the line Y—Y, respectively, for explaining the method for manufacturing the conventional semiconductor memory device including the field oxide film.
Figure 22B:
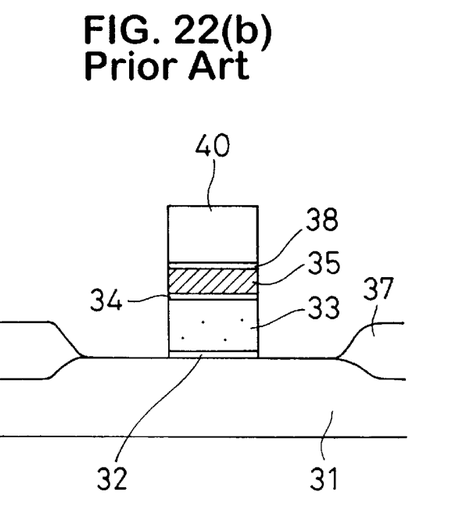

Further, the polysilicon layer 40a, the upper oxide film 38, the nitride film 35, the lower oxide film 34, the polysilicon layer 33a, and the gate insulating film 32 are successively etched for forming the floating gate 33 and the control gate 40 with the resist pattern for forming the control gate 40 used as a mask, as shown in FIGS. 22(a) and 22(b).

Afterwards, source/drain regions (not shown) of a cell array region of the flash memory are formed by ion implantation ($N^+$: $^{75}As^+$, 20 keV, $2\times10^{15}$/cm$^2$). Further, NSG of a thickness of 1000 Å and BPSG of a thickness of 5000 Å are deposited by CVD method as an interlayer insulating film (not shown), followed by performing a melt processing at 900° C. for 10 minutes, forming a contact hole by photoetching, depositing Al-Si-Cu to a thickness of 5000 Å by a sputtering method, and forming a metal wiring (not shown) by photoetching to complete the flash memory.

Figure 23A:
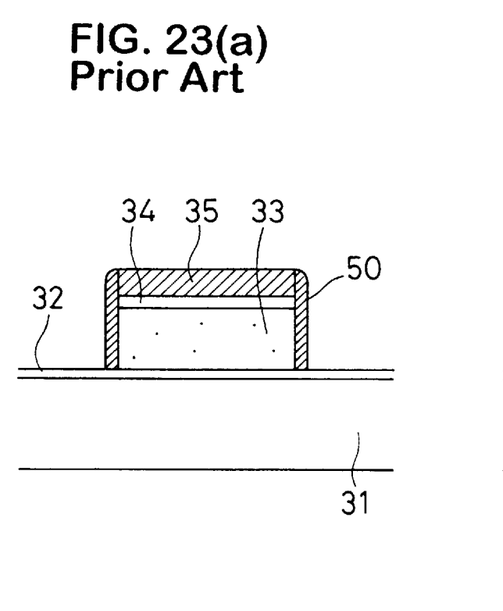
FIGS. 23(a) and 23(b) are schematic cross sections along the line X—X and the line Y—Y, respectively, for explaining a method for manufacturing another conventional semiconductor memory device including the field oxide film.
Figure 23B:
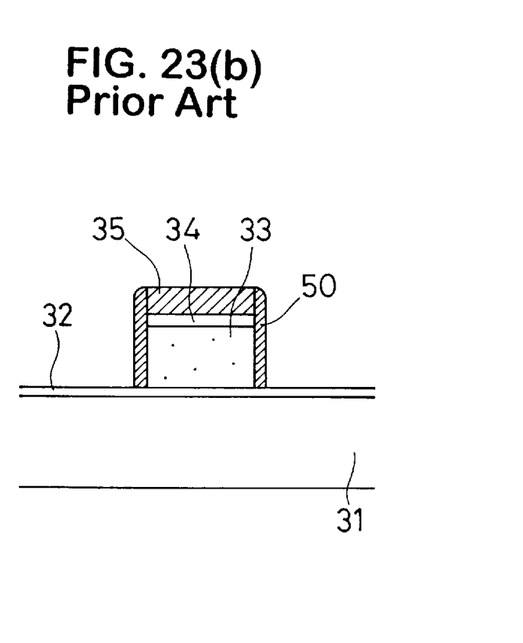

Here, in order to prevent oxidation of the sidewall of the polysilicon layer 33a in the above method, a nitride film is further deposited on the nitride film 35 before performing the LOCOS oxidation of FIG. 20, followed by etching back to form a sidewall spacer 50 on the sidewall of the nitride film 35, the lower oxide film 34 and the polysilicon layer 33a, as shown in FIGS. 23(a) and 23(b). Here, the gate insulating film 32 is used as an etching stopper at the time of forming the sidewall spacer 50.

The above conventional manufacturing method forms, for example, two regions on the substrate; one region including only the polysilicon layer 40a for the control gate having a thickness of about 1000 Å, and the other region including a laminated film formed of the polysilicon layer 33a for the floating gate having a thickness of about 1000 Å, the ONO film (34, 35, 38) and the polysilicon layer 40a for the control gate, as shown in FIG. 22. This gives rise to a step difference of more than about 1000 Å between the two regions. Therefore, in patterning the control gate, it is necessary to ensure the thickness of the field oxide film 37 under and near the end of the floating gate to be about 1000 Å as an etching margin at the time of simultaneous etching of the polysilicon layer 33a for the floating gate, ONO film (34,35,38) and the polysilicon layer 40a for the control gate. In other words, if a sufficient etching margin is not ensured, the field oxide film 37 will be etched off at the time of simultaneous etching of the polysilicon layer 33a for the floating gate, ONO film (34,35,38) and the polysilicon layer 40a for the control gate and, further, the underlying silicon substrate 31 itself will be etched. This causes impurity ions to be implanted into the silicon substrate 31 where the field oxide film 37 is etched at a later step of implanting the impurity ions for forming the source/drain regions, making the device isolation impossible or the breakdown voltage lowered.

Figure 24:
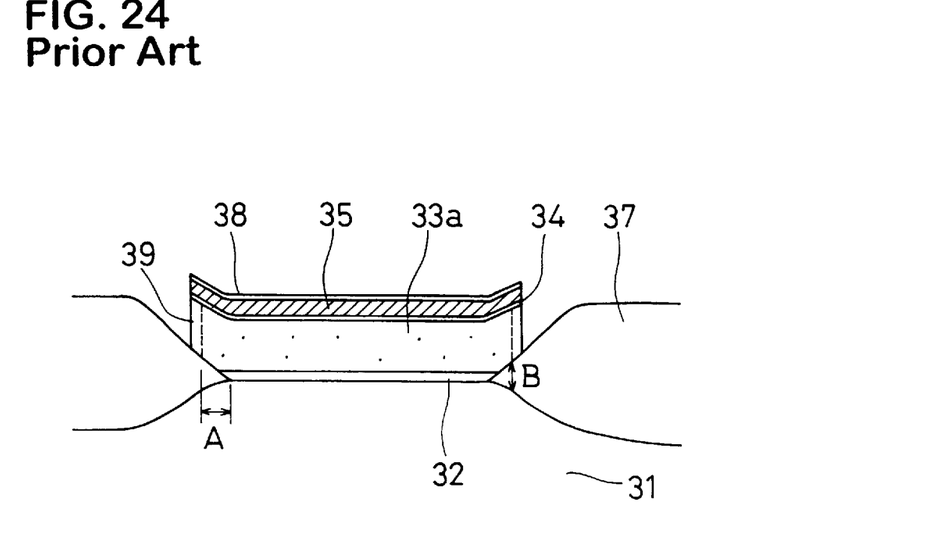
FIGS. 24 is a schematic cross section for explaining the size of a field oxide film of the conventional semiconductor memory device including the field oxide film.

However, if a thin field oxide film is to be formed in accordance with microminiaturization, the field oxide thickness at the edge of the floating gate pattern becomes less than enough for simultaneous etching of the polysilicon layer 33a for the floating gate, the ONO film and the polysilicon layer 40a for the control gate. For example, if a field oxide film of about 3000 Å is formed, the reach (A) of the bird's beak into the active region under the floating gate will be as small as about 500 Å, and the thickness (B in FIG. 24) of the field oxide film 37 under the end of the floating gate will be smaller than about 1000 Å.

Therefore, it is necessary to form a thick field oxide film 37 of about 6000 Å in order to ensure the thickness (B) of the etching margin to be about 1000 Å which corresponds to the step difference of the polysilicon layers or the like. If the filed oxide film 37 is formed to a thickness of about 6000 Å, the reach of the bird's beak of the field oxide film under the floating gate will be as large as about 1500 Å. This reduces the area of the active region. However, the wider area is necessary to obtain enough active region, so that the area occupied by the semiconductor memory device itself must inevitably be increased.

Here, it is possible to reduce the reach of the bird's beak by a sidewall spacer 50, as shown in FIG. 23. However, even in this case, the thickness (B) of the field oxide film 37 under the end of the floating gate is approximately the same as the above, causing a similar problem.

As mentioned earlier, recent semiconductor memory devices are oriented towards reduction of the driving voltages, thinning of the field oxide film, and reduction of the step difference caused by the field oxide film in accordance with the development of the microminiaturization technique. However, in view of protecting the substrate, it is difficult to achieve a sufficiently thin field oxide film, as described above.

SUMMARY OF THE INVENTION

The present invention provides a method for forming a field oxide film, including the steps of: (i) laminating a gate insulating film, a polysilicon layer and a first silicon nitride film over the entire surface of a semiconductor substrate; (ii) patterning the gate insulating film, the polysilicon layer and the first silicon nitride film to a desired shape; (iii) forming a sidewall spacer of a second silicon nitride film on a side wall of the gate insulating film, the polysilicon layer and the first silicon nitride film; (iv) selectively etching a portion of the semiconductor substrate with the first silicon nitride film and the sidewall spacer used as a mask; and (v) forming a field oxide film on the etched portion of the semiconductor substrate in a self-aligned manner relative to the polysilicon layer.

DETAILED DESCRIPTION OF THE PREFERRED EMBODIMENTS

At the step (i), the semiconductor substrate to be used in accordance with the forming method of the present invention is not specifically limited as long as it is a substrate generally used for forming a field oxide film. Among others, a silicon substrate is preferably used. A gate insulating film, a polysilicon layer, and a silicon nitride film is successively laminated on the semiconductor substrate. The gate insulating film may be formed to a thickness of about 100 to 150 Å by a conventional method, for example, by thermal oxidation for 15 to 20 minutes under an oxygen atmosphere and at 700° C. to 900° C. The polysilicon layer may be formed to a thickness of about 1000 to 1500 Å by a conventional method, for example, by CVD using silane ($SiH_4$), disilane ($Si_2H_6$) or the like. The polysilicon layer may preferably be doped with p-type or n-type impurity ions such as boron, phosphorus or arsenic ions to a concentration of about $5.0 \times 10^{14}$ to $8.0 \times 10^{14}$ $cm^{-3}$. The polysilicon layer formed at this step is preferably used for forming the floating gate. However, the polysilicon layer may be intended for any use as long as the polysilicon layer possibly creates a problem of etching at a later step due to the step difference based on the polysilicon layer. The silicon nitride film may be formed to a thickness of about 1000 to 1200 Å by a conventional method such as LP-CVD.

At the step (ii), the gate insulating film, the polysilicon layer and the silicon nitride film laminated on the semiconductor substrate are patterned to a desired shape. The patterning at this step may preferably be performed as follows. A resist pattern is formed by photolithography and an etching process so as to cover the entire active region defined by the field oxide film to be formed at a later step. With the resist pattern used as a mask, only the silicon nitride film is patterned first. Subsequently, with the patterned silicon nitride film used as a mask, the polysilicon layer and the gate insulating film are successively patterned.

At the step (iii), a sidewall spacer of silicon nitride film is formed on the sidewall of the gate insulating film, the polysilicon layer and the silicon nitride film. The sidewall spacer may be formed by depositing a silicon nitride film to a thickness of about 1000 to 1500 Å over the entire surface of the semiconductor substrate including the gate insulating film, the polysilicon layer, and the silicon nitride film in the same manner as in the above and by etching back.

At the step (iv), a portion of the semiconductor substrate is selectively etched with the silicon nitride film and the sidewall spacer used as a mask. The method of etching the semiconductor substrate at this step may be preferably one that can ensure a selective etching ratio between the substrate material and the silicon nitride film. Specifically, the etching may preferably performed by using a plasma source capable of low voltage discharge below several millivoltages to several tens of millivoltages, using $Cl_2$ as a main gas and $O_2$ gas, and using an RP power of several tens to several hundreds of watts. The etching of the semiconductor substrate at this step may preferably performed on only the region where a field oxide film is to be formed at a later step. The etching depth may be determined in accordance with the desired thickness of the field oxide film. From another point of view, if the overetching of the region in the field oxide film caused by patterning the polysilicon and the like at a later step is to become a problem, the etching depth of the semiconductor substrate may be about ½ to 9/10, preferably about ¾, of the expected depth of the overetching. Specifically, if the thickness of the field oxide film is about 2000 to 3000 Å, the etching depth of the semiconductor substrate may be preferably about 800 to 1000 Å.

At the step (v), a field oxide film is formed on the etched region of the semiconductor substrate in a self-aligned manner relative to the polysilicon layer. The field oxide film may be preferably formed to a thickness of about 2000 to 3000 Å by performing a pyrooxidation for 30 to 40 minutes at a temperature range of 850° to 1050° C. with the silicon nitride film and the sidewall spacer used as an anti-oxidation mask.

Subsequently, the silicon nitride film and the sidewall spacer are removed with heated phosphoric acid or the like. Then, an insulating layer is formed over the entire surface of the semiconductor substrate including the polysilicon layer. A polysilicon layer is further laminated on the insulating layer as an upper polysilicon layer. Then, the lower polysilicon layer, the insulating layer and the upper polysilicon layer are successively patterned to a desired shape. Thus, the semiconductor memory device having a floating gate and a control gate is completed. The insulating layer to be formed at this step is not specifically limited. A silicon oxide film, a silicon nitride film, a laminated film thereof (an ONO film), or the like may be formed to a thickness of 150 to 250 Å as an insulating layer. If the ONO film is to be formed, the ONO film may be preferably formed by laminating an HTO film of about 70 to 100 Å, a silicon nitride film of 100 to 150 Å, and an HTO film of about 100 to 150 Å. The upper polysilicon layer formed at this step may be preferably used for forming the control gate. However, the upper polysilicon layer may be intended for any use as long as it is a polysilicon layer to be patterned together with the lower polysilicon layer.

In the present invention, the sidewall of the gate insulating film is covered with a silicon nitride film. Here, there is a problem that oxidation from the semiconductor substrate side causes the end of the floating gate to be lifted up. In other words, since oxygen is diffused from the edge of the floating gate through the gate insulating film at the time of LOCOS oxidation, the region of the substrate surface covered by the floating gate is also oxidized in the present invention. Accordingly, oxidation proceeds more easily in a region near the edge. As a result of this, the thickness of the tunnel oxide film tends to grow thicker gradually from the center to the edge (100 Å at the center, and 200 to 300 Å at the edge). In order to prevent lifting up of the end of the floating gate, the gate insulating film or, more precisely, a portion of the gate insulating film near the interface between the gate insulating film and the semiconductor substrate may be preferably doped with nitrogen at the above step (i). Here, the nitrogen content may be preferably about 0.7 to 1.0 atom % with respect to the whole atoms in the gate insulating under the gate electrode. The gate insulating film may be doped with nitrogen by, for example, (1) treating the gate insulating film with $N_2O$ gas, (2) treating the gate insulating film with $NH_3$ gas, or (3) implanting nitrogen ions into the gate insulating film. In (1), the gate insulating film may be treated with $N_2O$ gas by, for example, performing a treatment under $N_2O$ gas atmosphere at about 700° to 900° C. for about 15 to 20 minutes after the formation of the gate insulating film. In (2), the gate insulating film may be treated with $NH_3$ gas by, for example, performing a treatment under $NH_3$ gas atmosphere at about 800° to 1500° C. for about 20 to 40 seconds after the formation of the gate insulating film. In (3), the gate insulating film may be doped with nitrogen by, for example, implanting nitrogen ions at an implantation energy of about 10 to 20 KeV and in a dose of $1.0 \times 10^{15}$ to $2.0 \times 10^{15}$ cm$^{-2}$.

In NOR-type flash memories using LOCOS for device isolation in cell regions (flash memories using the present invention), the method using CHE (Channel Hot Electrons) is generally used. The cell operation of CHE-writing type flash memories will be hereinafter explained.

At the time of writing, 12V is applied to the control gate, 0V to the source, and 5V to the drain so as to inject the channel hot electrons generated near the drain into the floating gate. This raises the Vth (threshold voltage) of the memory cell to more than 5V.

At the time of erasing, −10V is applied to the control gate, 5V to the source, and the drain is left open (disconnected) so as to allow the FN tunnel currents to flow from the floating gate to the source, thereby to draw the electrons out of the floating gate. This reduces the Vth of the memory cell to be less than 5V.

At the time of reading, 5V is applied to the control gate, 0V to the source, and 1V to the drain for sensing whether the currents flow or not.

According to this method, a voltage as high as 12V is applied at the time of writing and, since the device isolation region should not be short-circuited during this operation, the thickness of the LOCOS film had to be as large as 3000 to 4000 Å.

On the other hand, NOR-type flash memories have been recently developed in which the FN currents are used for writing. In such a case, the Vth after the writing/erasing operation is reversed as compared with the operation in the CHE writing type flash memories. The operations of the NOR-type flash memories will be hereinafter briefly explained.

At the time of writing, −10V is applied to the control gate, 5V to the drain, and the source is left open (disconnected) so as to allow the FN tunnel currents to flow from the floating gate to the drain, thereby to draw the electrons out of the floating gate. This reduces the Vth of the memory cell to be less than 5V.

At the time of erasing, 10V is applied to the control gate, −8V to the source, and the drain is left open so as to allow the FN currents to flow from the substrate (the channel) to the floating gate, thereby to inject the electrons into the floating gate. This reduces the Vth (threshold voltage) of the memory cell to be more than 5V.

At the time of reading, 5V is applied to the control gate, 0V to the source, and 1V to the drain for sensing whether the currents flow or not.

Even by this method, a high voltage is applied to the control gate at the time of erasing. However, since the erasing operation is performed block by block instead of cell by cell, it is permissible that the device isolation region may be short-circuited. The limitative condition is that the short circuit of the device isolation region should not occur at the time of reading. (Since a negative voltage is applied to the control gate at the time of writing, the device isolation region will not be short-circuited during the writing operation.) This can reduce the thickness of the LOCOS film to be as small as 1000 to 2000 Å. In this case, the aforementioned drawbacks can be lessened to a great extent, rendering the present invention easier to adopt.

EXAMPLES

The method for forming a field oxide film according to the present invention will hereinafter be explained in conjunction with the attached drawings, which are not to be construed as being intended to limit the scope of the present invention.

Example 1

FIG. 1 is a plan view of a flash memory. The plan view is similar to that of the prior art. Referring to the flash memory shown in FIG. 1, an active region 20 is defined on a silicon substrate 11 by a device isolation region formed of a LOCOS oxide film 17. A floating gate 13 is formed via a gate insulating film (not shown) on only the active region 20. A control gate 19 serving as a word line is formed over the floating gate 13 via an ONO film (not shown) and extends from the LOCOS oxide film 17 to the active region 20. Also, source/drain regions 21a, 21b are formed in the active region 20 on both sides of the floating gate 13 and the control gate 19.

A method for manufacturing the above flash memory will be hereinafter explained in conjunction with FIG. 2 to FIG. 9. Figures (a) each represent a view showing a cross section along the line X—X of FIG. 1, and Figures (b) each represent a view showing a ross section along the line Y—Y of FIG. 1.

Figure 2A:
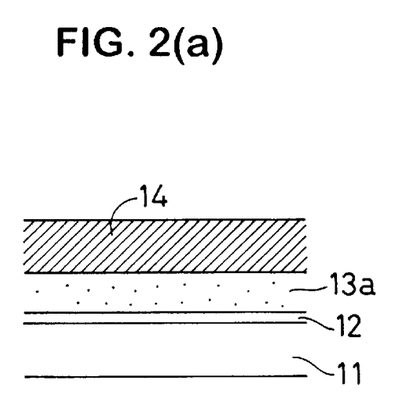
FIGS. 2(a) and 2(b) are schematic cross sections along the line X—X and the line Y—Y, respectively, for explaining a method for manufacturing the semiconductor memory device of FIG. 1 including the field oxide film according to the present invention.
Figure 2B:
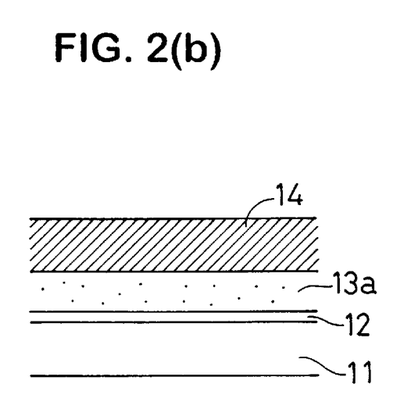

First, a gate insulating film 12 is formed to a thickness of about 100 Å on a surface of a p-type silicon substrate 11, and then a polysilicon layer 13a for a floating gate is formed to a thickness of 1000 Å, as shown in FIGS. 2(a) and 2(b). Further, impurity ions are implanted into the polysilicon layer 13a by ion implantation (N$^+$: $^{31}$P$^+$, 30 keV, $2 \times 10^{15}$/cm$^2$). Subsequently, a first nitride film 14 is formed to a thickness of 1400 Å on the polysilicon layer 13a.

Figure 3A:
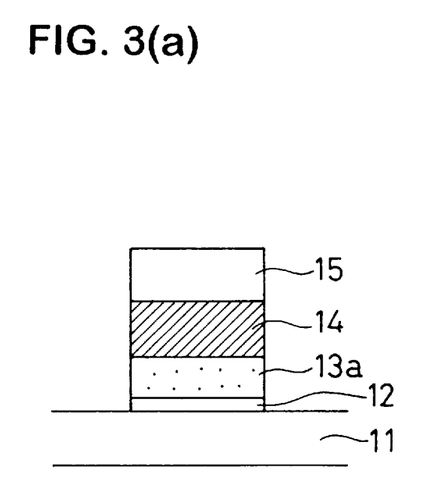
FIGS. 3(a) and 3(b) are schematic cross sections along the line X—X and the line Y—Y, respectively, for explaining the method for manufacturing the semiconductor memory device of FIG. 1 including the field oxide film according to the present invention.
Figure 3B:
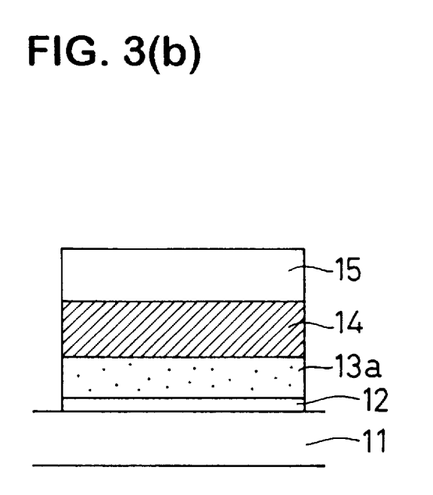

Then, a resist pattern 15 is formed on the nitride film 14 to cover the entire surface of the active region on the silicon substrate 11. With the resist pattern 15 used as a mask, the first nitride film 14, the polysilicon layer 13a, and the gate insulating film 12 are successively etched, as shown in FIGS. 3(a) and 3(b).

Figure 4A:
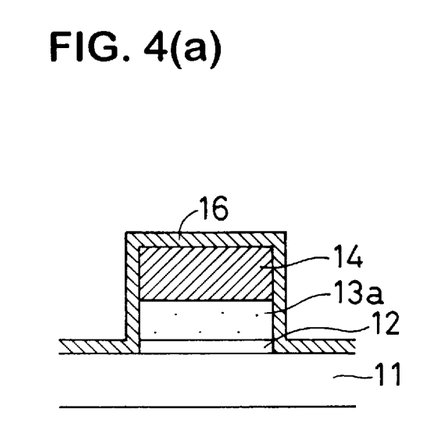
FIGS. 4(a) and 4(b) are schematic cross sections along the line X—X and the line Y—Y, respectively, for explaining the method for manufacturing the semiconductor memory device of FIG. 1 including the field oxide film according to the present invention.
Figure 4B:
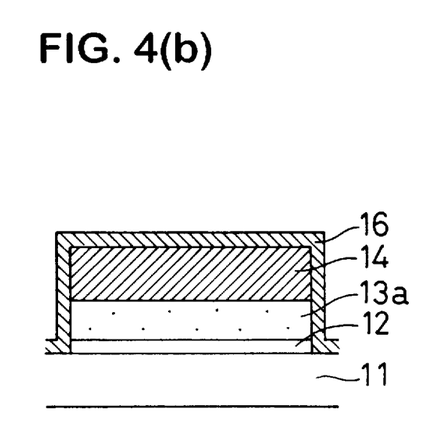

Subsequently, the resist pattern 15 is removed, and a second nitride film 16 is formed over the entire surface of the silicon substrate 11, as shown in FIGS. 4(a) and 4(b).

Figure 5A:
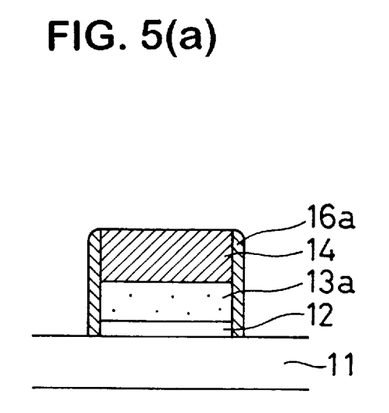
FIGS. 5(a) and 5(b) are schematic cross sections along the line X—X and the line Y—Y, respectively, for explaining the method for manufacturing the semiconductor memory device of FIG. 1 including the field oxide film according to the present invention.
Figure 5B:
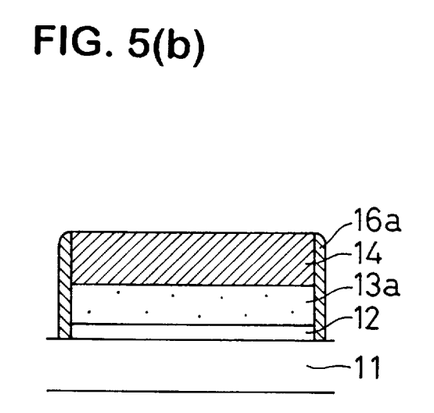

Then, a sidewall spacer 16a is formed on the sidewall of the first nitride film 14, the polysilicon layer 13a and the gate insulating film 12 by etching back the second nitride film 16, as shown in FIGS. 5(a) and 5(b). The side wall spacer 16a will serve as an anti-oxidation mask against the polysilicon layer 13a at a later step of LOCOS oxidation.

Figure 6A:
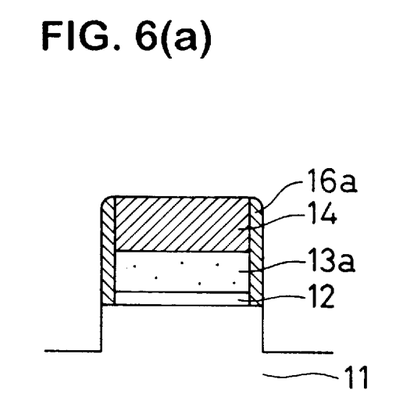
FIGS. 6(a) and 6(b) are schematic cross sections along the line X—X and the line Y—Y, respectively, for explaining the method for manufacturing the semiconductor memory device of FIG. 1 including the field oxide film according to the present invention.
Figure 6B:
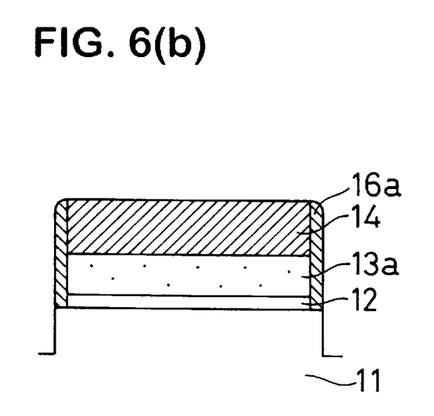

Subsequently, the silicon substrate 11 is etched by 900 Å with the first nitride film 14 and the sidewall spacer 16a of the second nitride film used as a mask, as shown in FIGS. 6(a) and 6(b).

Figure 7A:
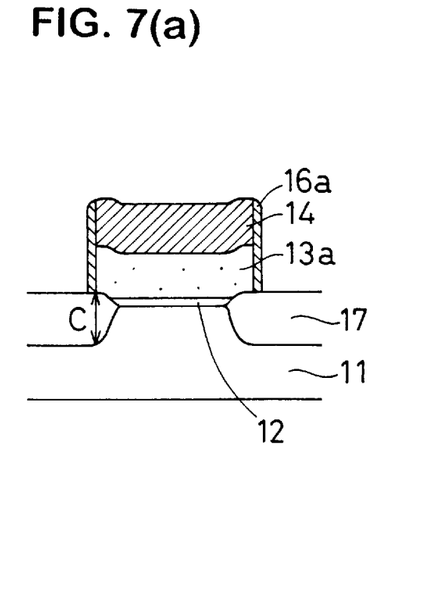
FIGS. 7(a) and 7(b) are schematic cross sections along the line X—X and the line Y—Y, respectively, for explaining the method for manufacturing the semiconductor memory device of FIG. 1 including the field oxide film according to the present invention.
Figure 7B:
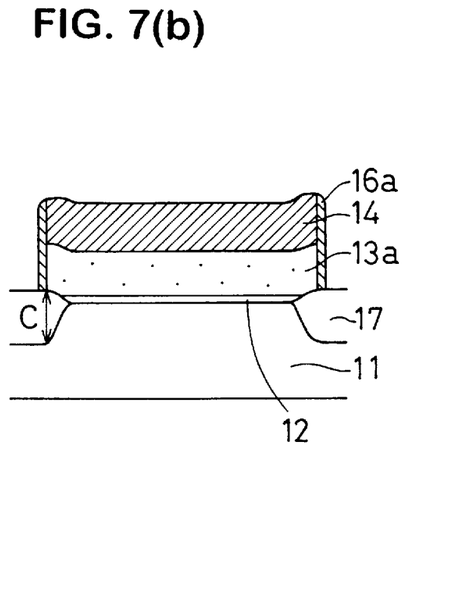

Next, selective LOCOS oxidation is performed on the silicon substrate 11 to form a field oxide film 17 of about 2500 Å for device isolation of the active region, as shown in FIGS. 7(a) and 7(b).

Then, after removing the first nitride film 14 and the sidewall spacer 16a of the second nitride film with heated phosphoric acid, an ONO film 18 (HTO 100 Å/ SiN 200 Å/

Figure 8A:
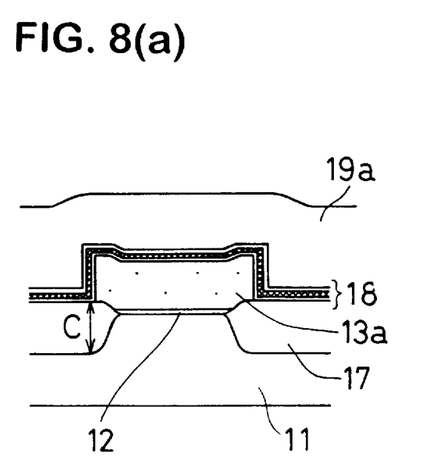
FIGS. 8(a) and 8(b) are schematic cross sections along the line X—X and the line Y—Y, respectively, for explaining the method for manufacturing the semiconductor memory device of FIG. 1 including the field oxide film according to the present invention.
Figure 8B:
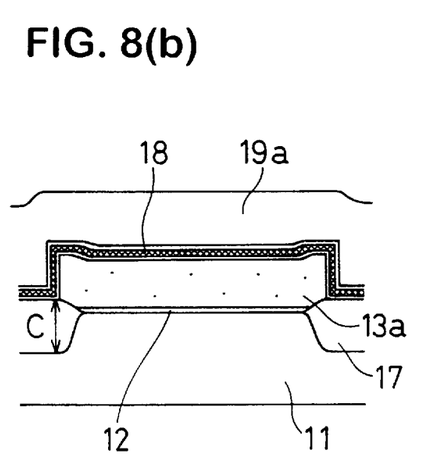

HTO 100 Å) is deposited on the entire surface of the silicon substrate 11. Further, a polysilicon layer 19a for a control gate is deposited to a thickness of 1000 Å, as shown in FIGS. 8(a) and 8(b), and ion implantation (N$^+$: $^{31}$P$^+$, 60 keV, 2×10$^{15}$/cm$^2$) is carried out into the polysilicon layer 19a.

Figure 9A:
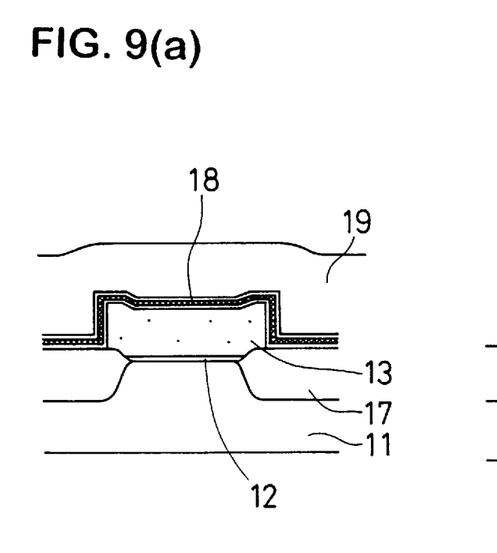
FIGS. 9(a) and 9(b) are schematic cross sections along the line X—X and the line Y—Y, respectively, for explaining the method for manufacturing the semiconductor memory device of FIG. 1 including the field oxide film according to the present invention.
Figure 9B:
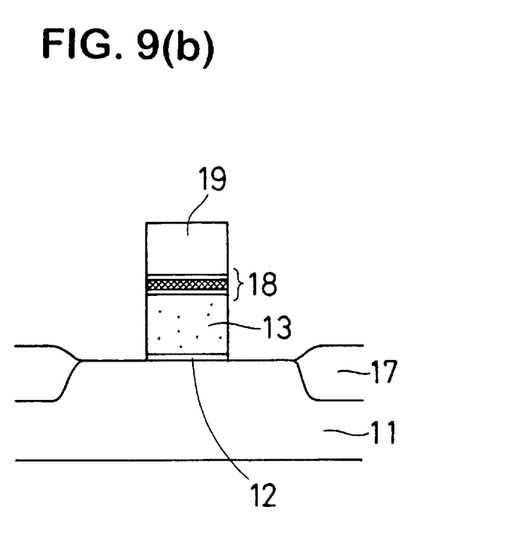

Further, the polysilicon layer 19a, the ONO film 18, the polysilicon layer 13a and the gate insulating film 12 are successively etched for forming the floating gate 13 and the control gate 19 with a resist pattern (not shown) used as a mask, as shown in FIGS. 9(a) and 9(b).

Afterwards, source/drain regions (not shown) of a cell array region of the flash memory are formed by ion implantation (N$^+$: $^{75}$As$^+$, 20 keV, 2×10$^{15}$/cm$^2$). Further, NSG of a thickness of 1000 Å and BPSG of a thickness of 5000 Å are deposited by CVD method as an interlayer insulating film (not shown), followed by performing a melt processing at 900° C. for 10 minutes, forming a contact hole by photoetching, depositing Al-Si-Cu to a thickness of 5000 Å by a sputtering method, and forming a metal wiring (not shown) by photoetching to complete the flash memory.

As described above, oxidation on the sidewall of the polysilicon layer 13a and the gate insulating film 12 can be prevented by using the first nitride film 14 and the sidewall spacer 16a as an anti-oxidation mask at the time of LOCOS oxidation. Therefore, lifting up of the polysilicon layer 13a caused by the bird's beak of the LOCOS oxidation coming under the polysilicon layer 13a can be reduced. Also, a sidewall of the silicon substrate 11 is formed by etching the silicon substrate 11 in a self-aligned manner with the first nitride film 14 and the sidewall spacer 16a used as a mask. Since the sidewall of the silicon substrate 11 is oxidized at the time of LOCOS oxidation, the thickness (C in FIGS. 7 and 8) of the field oxide film 17 under the end of the polysilicon layer 13a can be sufficiently ensured. Accordingly, the thickness of the field oxide film itself can be as small as about 2500 Å in order to ensure the etching margin at the time of simultaneous etching of the polysilicon layer 13a for the floating gate and the polysilicon layer 19a for the control gate.

Example 2

Figure 10A:
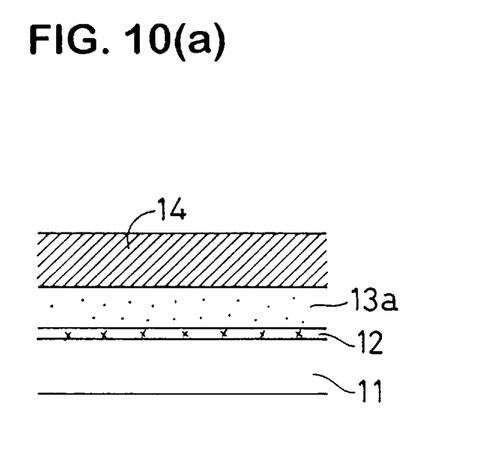
FIGS. 10(a) and 10(b) are schematic cross sections along the line X—X and the line Y—Y, respectively, for explaining a different method for manufacturing the semiconductor memory device of FIG. 1 including the field oxide film according to the present invention.
Figure 10B:
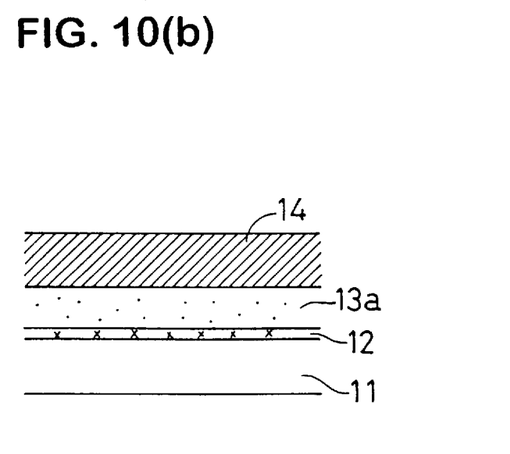

First, as shown in FIGS. 10(a) and 10(b), a gate insulating film 12 is formed to a thickness of about 100 Å by treating the surface of a p-type silicon substrate 11 under oxygen gas atmosphere at 900° C. for 20 minutes and, successively, the interface between the silicon substrate 11 and the gate insulating film 12 is doped with nitrogen (represented by X in FIGS. 10(a), 10(b) and afterwards) at a concentration of about 0.7% (about 1% in the gate insulating film 12) by treating the silicon substrate 11 under N$_2$O gas atmosphere (100%) at 950° C. for 15 minutes. Then, a polysilicon layer 13a for a floating gate and a first nitride film 14 are formed as described before.

Figure 11A:
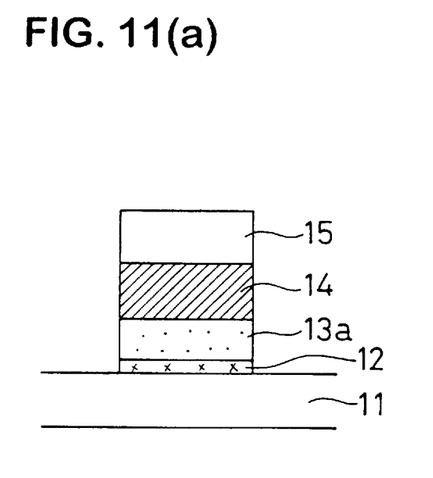
FIGS. 11(a) and 11(b) are schematic cross sections along the line X—X and the line Y—Y, respectively, for explaining the different method for manufacturing the semiconductor memory device of FIG. 1 including the field oxide film according to the present invention.
Figure 11B:
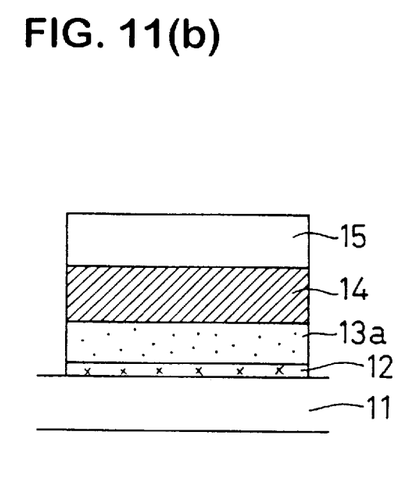
Figure 12A:
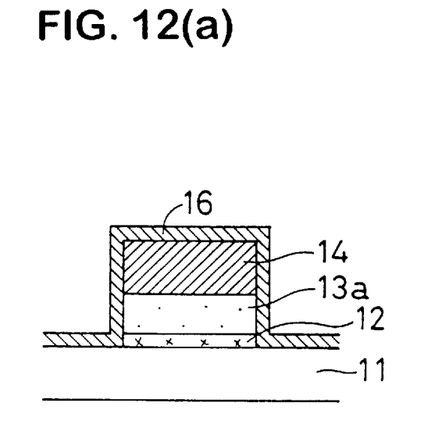
FIGS. 12(a) and 12(b) are schematic cross sections along the line X—X and the line Y—Y, respectively, for explaining the different method for manufacturing the semiconductor memory device of FIG. 1 including the field oxide film according to the present invention.
Figure 12B:
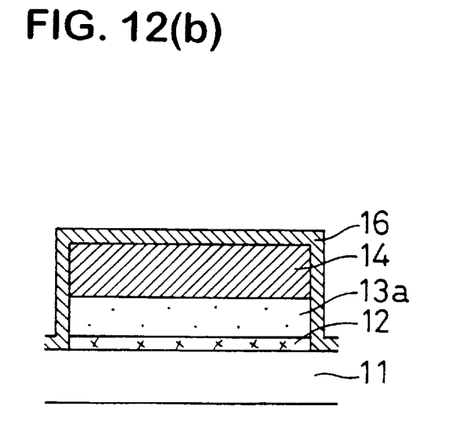
Figure 13A:
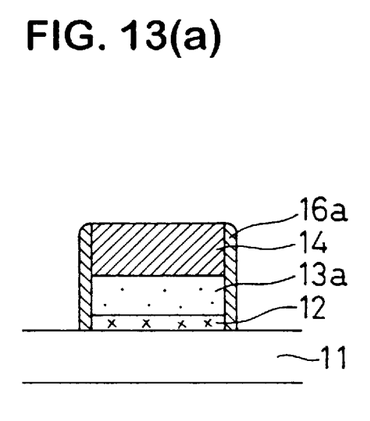
FIGS. 13(a) and 13(b) are schematic cross sections along the line X—X and the line Y—Y, respectively, for explaining the different method for manufacturing the semiconductor memory device of FIG. 1 including the field oxide film according to the present invention.
Figure 13B:
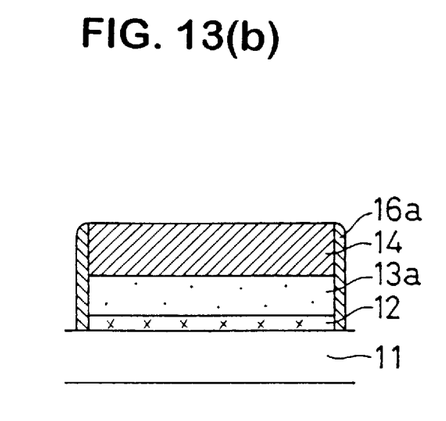

Subsequently, as shown in FIGS. 11(a) and 11(b), a resist pattern 15 is formed as described before, and the first nitride film 14, the polysilicon layer 13a and the gate insulating film 12 are successively etched with the resist pattern 15 used as a mask. Next, as shown in FIGS. 12(a) and 12(b), a second nitride film 16 is formed as described before. Then, as shown in FIGS. 13(a) and 13(b), the second nitride film 16 is formed into a sidewall spacer 16a as described before.

Figure 14A:
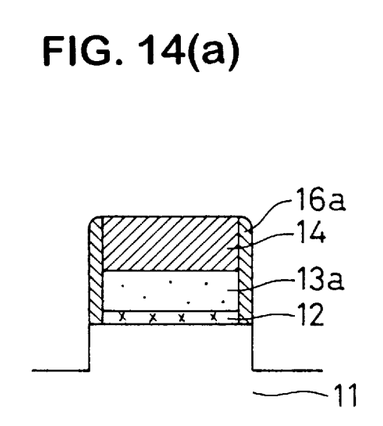
FIGS. 14(a) and 14(b) are schematic cross sections along the line X—X and the line Y—Y, respectively, for explaining the different method for manufacturing the semiconductor memory device of FIG. 1 including the field oxide film according to the present invention.
Figure 14B:
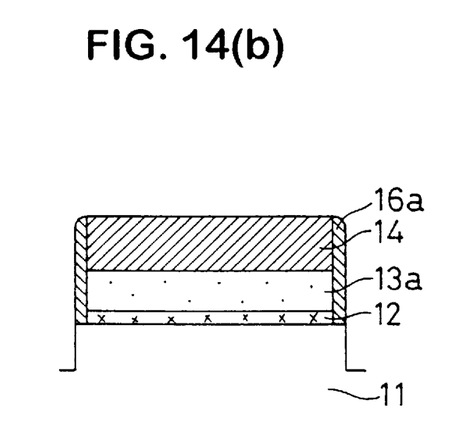
Figure 15A:
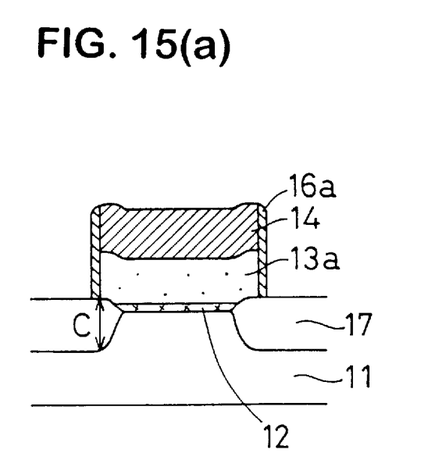
FIGS. 15(a) and 15(b) are schematic cross sections along the line X—X and the line Y—Y, respectively, for explaining the different method for manufacturing the semiconductor memory device of FIG. 1 including the field oxide film according to the present invention.
Figure 15B:
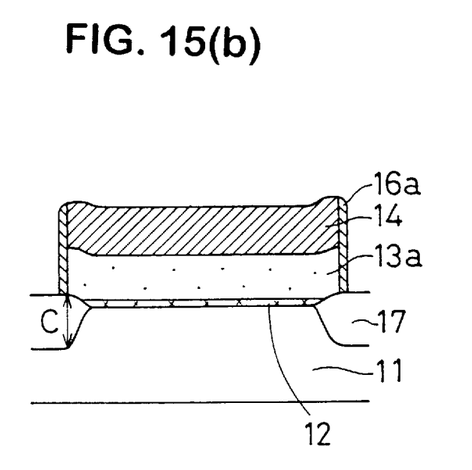

Further, as shown in FIGS. 14(a) and 14(b), the silicon substrate 11 is etched as described before, and device isolation for an active region is carried out as shown in FIGS. 15(a) and 15(b).

Figure 16A:
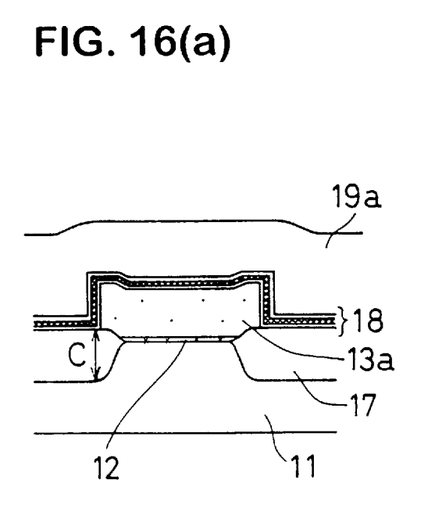
FIGS. 16(a) and 16(b) are schematic cross sections along the line X—X and the line Y—Y, respectively, for explaining the different method for manufacturing the semiconductor memory device of FIG. 1 including the field oxide film according to the present invention.
Figure 16B:
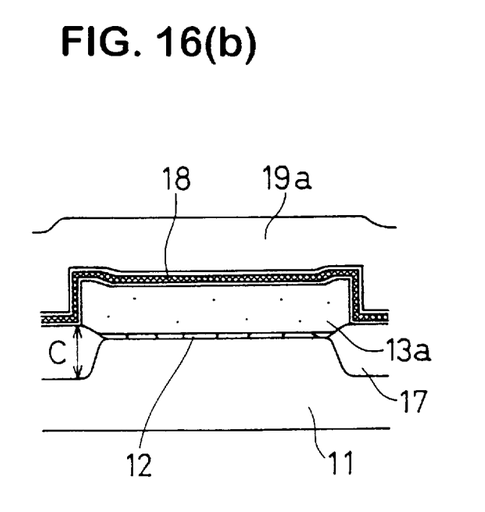
Figure 17A:
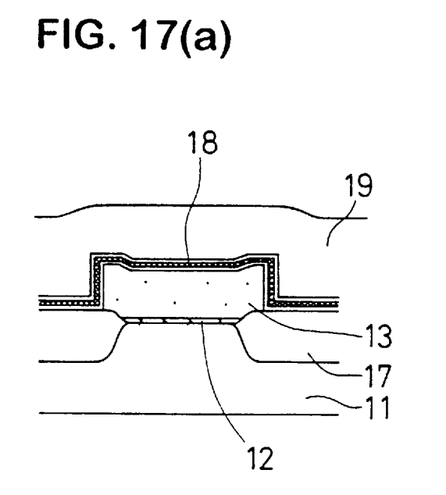
FIGS. 17(a) and 17(b) are schematic cross sections along the line X—X and the line Y—Y, respectively, for explaining the different method for manufacturing the semiconductor memory device of FIG. 1 including the field oxide film according to the present invention.
Figure 17B:
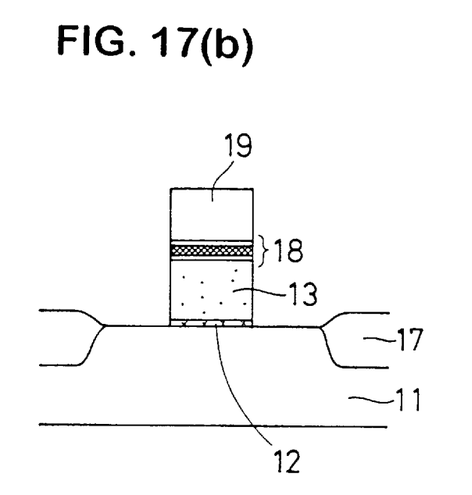

Subsequently, as shown in FIGS. 16(a) and 16(b), an ONO film 18 and a polysilicon layer 19a for a control gate are formed as described before. The polysilicon layer 19a, the ONO film 18, the polysilicon layer 13a and the gate insulating film 12 are successively etched to form the floating gate 13 and the control gate 19, as shown in FIGS. 17(a) and 17(b).

The flash memory is then completed by performing steps similar to those described before.

By doping the gate insulating film 12 at the interface between the silicon substrate 11 and the gate insulating film 12 with nitrogen (X in the gate insulating film 12), it is possible to prevent the bird's beak from coming under the floating gate at the time of LOCOS oxidation performed at a later step, as described before. Also, quality of the gate insulating film 12 can be improved.

Example 3

First, a gate insulating film is formed to a thickness of about 100 Å by treating the surface of a p-type silicon substrate with diluted oxygen gas at 900° C. for 20 minutes and, successively, the interface between the silicon substrate and the gate insulating film is doped with nitrogen at a concentration of about 1% (about 5% in the gate insulating film) by treating the silicon substrate under NH$_3$ gas atmosphere (100%) at 1000° C. for 30 seconds.

A similar flash memory is then completed by performing the manufacturing steps similar to those described before.

Example 4

First, a gate insulating film is formed to a thickness of about 100 Å by treating the surface of a p-type silicon substrate with diluted oxygen gas at 900° C. for 20 minutes and, successively, the interface between the silicon substrate and the gate insulating film is doped with nitrogen at a concentration of about 1% by implanting nitrogen ions into the gate insulating film (10 keV, 1×10$^{15}$/cm$^2$).

A similar flash memory is then completed by performing the manufacturing steps similar to those described before.

According to the forming method of the present invention, oxidation from the sidewall of the polysilicon layer and the gate insulating film can be prevented by etching the semiconductor substrate in a self-aligned manner with the silicon nitride film and the sidewall spacer used as a mask and by forming a field oxide film using this mask. Therefore, lifting up of the polysilicon layer caused by the bird's beak of the field oxide film coming under the polysilicon layer can be reduced. Also, horizontal extension (in a direction parallel to the substrate surface) of the bird's beak can be controlled. Further, since the sidewall of the etched semiconductor substrate is oxidized, the thickness of the field oxide film under the end of the polysilicon layer can be sufficiently ensured. Accordingly, the thickness of the field oxide film itself can be reduced in order to ensure the etching margin at a later step of etching the polysilicon layer and the like on the semiconductor substrate. This leads to planarization of the surface of the semiconductor substrate.

Further, if the gate insulating film at the interface between the silicon substrate and the gate insulating film is doped with nitrogen, it is possible to prevent the bird's beak from coming under the floating gate at the time of forming the field oxide film. Also, quality of the gate insulating film can be improved. This leads to increase in the number of rewriting times for the semiconductor memory device and to improvement in its lifetime.

What we claim is:

1. A method for forming a field oxide film for a floating gate memory device, comprising the steps of:

(i) laminating a gate insulating film, a polysilicon layer and a first silicon nitride film, in that order, over the entire surface of a semiconductor substrate;

(ii) patterning the gate insulating film, the polysilicon layer and the first silicon nitride film to a desired shape;

(iii) forming a sidewall spacer of a second silicon nitride film on a side wall of the patterned gate insulating film, polysilicon layer and first silicon nitride film;

(iv) selectively etching a portion of the semiconductor substrate with the first silicon nitride film and the sidewall spacer used as a mask;

(v) forming a field oxide film on the etched portion of the semiconductor substrate in a self-aligned manner relative to the polysilicon layer, where the mask is formed by the first silicon nitride film and the sidewall spacer;

(vi) removing the first silicon nitride film and the sidewall spacer of the mask;

(vii) forming an insulating layer over the entire surface of the semiconductor substrate, including the polysilicon layer, (viii) laminating a second polysilicon layer on the insulating layer, and (ix) successively etching the second polysilicon layer, the insulating layer, the gate insulating film and the polysilicon layer to form a control gate and a floating gate of the floating gate memory device.

2. A method for forming a field oxide film according to claim 1, in which the gate insulating film is an oxide film containing nitrogen at the interface to the substrate.

3. A method for forming a field oxide film according to claim 1, in which after the gate insulating film is formed in step (i) the gate insulating film is treated with $N_2O$ or $NH_3$ gas to incorporate nitrogen atoms therein.

4. A method for forming a field oxide film according to claim 1, in which after the gate insulating film is formed in step (i) the gate insulating film is implanted with nitrogen ions to incorporate nitrogen atoms therein.

5. A method for forming a field oxide film according to claim 3, in which a number of nitrogen atoms in the gate insulating film is about 0.7% to about 1.0% of the total number of atoms in the gate insulating film.

6. A method for forming a field oxide film according to claim 4, in which the gate insulating film is implanted with nitrogen ions in a dose of $10 \times 10^{15}$ to $2.0 \times 10^{15} cm^{-2}$.

7. A method for forming a field oxide film according to claim 1 wherein the insulating layer between the floating gate and control gate is a three layer structure having an oxide film, a nitride film and an oxide film.

* * * * *